(12) United States Patent
Ben-Tzur et al.

(10) Patent No.: US 7,192,867 B1
(45) Date of Patent: Mar. 20, 2007

(54) PROTECTION OF LOW-K DIELECTRIC IN A PASSIVATION LEVEL

(75) Inventors: Mira Ben-Tzur, Sunnyvale, CA (US); Krishnaswamy Ramkumar, San Jose, CA (US); Seurabh Dutta Chowdhury, Belmont, CA (US); Michal Efrati Fastow, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 257 days.

(21) Appl. No.: 10/184,336

(22) Filed: Jun. 26, 2002

(51) Int. Cl.
*H01L 21/302* (2006.01)

(52) U.S. Cl. .................. 438/689; 438/698; 438/745

(58) Field of Classification Search ................ 438/689, 438/694, 745, 698; 134/1.3
See application file for complete search history.

(56) References Cited

U.S. PATENT DOCUMENTS

| | | | | |
|---|---|---|---|---|
| 5,172,212 A | * | 12/1992 | Baba ........................... | 257/738 |
| 5,668,398 A | | 9/1997 | Havemann et al. .......... | 257/522 |
| 5,918,149 A | | 6/1999 | Besser et al. ................ | 438/680 |
| 5,946,601 A | * | 8/1999 | Wong et al. ................. | 438/783 |
| 5,963,830 A | | 10/1999 | Wang et al. ................. | 438/653 |
| 6,100,184 A | * | 8/2000 | Zhao et al. .................. | 438/638 |
| 6,120,844 A | | 9/2000 | Chen et al. ............. | 427/255.28 |
| 6,204,200 B1 | | 3/2001 | Shieh et al. ................. | 438/778 |
| 6,228,761 B1 | | 5/2001 | Ngo et al. ................... | 438/637 |
| 6,281,115 B1 | * | 8/2001 | Chang et al. ................ | 438/637 |
| 6,522,005 B1 | | 2/2003 | Allman et al. .............. | 257/758 |

OTHER PUBLICATIONS

Seong Geon park, et al. "A New ALD-TiN/CoSi2 Contact Plug Process for Reliable and Low Defect Density Bit-Line Integration in Sub-Quarter Micron Giga-bit DRAM" IEEE 2002, pp. 282-284; Semiconductor R&D Center, Samsung Electronics Co. LTD., Korea.

J.T. Wetzel, et al. "Evaluation of Material Property Requirements and Performance of Ultra-Low Dielectric Constant Insulators for Inlaid Copper Metallization" IEEE 2001, pp. 4.11.-4.1.3: Int'l Sematech, Austin, TX; Texas Instruments, Dallas, TX; Motorola, Austin, TX; TSMC, Taiwan; IBM, Burlington.

M. Ben-Tzur, et al. "Integrated of Low-K Dielectrics in The Passivation Level of Al Based Multilevel Interconnect Technology" submitted for Publication Mar. 2002, (2 pgs); Cypress Semiconductor, San Jose, CA., USA.

(Continued)

*Primary Examiner*—Nadine Norton
*Assistant Examiner*—Lynette T. Umez-Eronini
(74) *Attorney, Agent, or Firm*—Okamoto & Benedicto LLP

(57) ABSTRACT

In one embodiment, a passivation level includes a low-k dielectric. To prevent the low-k dielectric from absorbing moisture when exposed to air, exposed portions of the low-k dielectric are covered with spacers. As can be appreciated, this facilitates integration of low-k dielectrics in passivation levels. Low-k dielectrics in passivation levels help lower capacitance on metal lines, thereby reducing RC delay and increasing signal propagation speeds.

13 Claims, 8 Drawing Sheets

OTHER PUBLICATIONS

Wei-Jen Hsia, et al. "Flowfill Technology Low Dielectric Constant Materials" Retrieved from the internet:<URL:http//www.trikon.com [printed on Mar. 29, 2002] (4 pgs); LSI Logic, CA; Trikon Technologies Ltd.

Bruce W. McGaughy, et al. "A Simple Method for On-Chip, Sub-Femto Farad Interconnect Capacitance Measurement" IEEE vol. 18, No. 1 Jan. 1997, pp. 21-23: University of California, Berkeley, CA., USA.

Conference highlights latest data on SiLK resin, expanded Alliance membership, (3 pgs); Dec. 5, 2001; The Dow Chemical Company and Loomis Group; Midland, Michigan, USA.

Interconnect: The International Technology Roadmap For Semiconductors, pp. 1-25, 2001 Edition.

* cited by examiner

PROTECTION OF LOW-K DIELECTRIC IN A PASSIVATION LEVEL

REFERENCE TO RELATED APPLICATION

This application is related to the following commonly-assigned disclosure, which is incorporated herein by reference in its entirety: U.S. application Ser. No. 10/183,095, now U.S. Pat. No. 6,660,661, entitled "INTEGRATED CIRCUIT WITH IMPROVED RC DELAY,"filed on the same day as this application by Mira Ben-Tzur, Krishnaswamy Rainkumar, Alain Blosse, and Fuad Badrieh.

BACKGROUND OF THE INVENTION

1. Field of the Invention

The present invention relates generally to integrated circuits, and more particularly to integrated circuit fabrication processes and structures.

2. Description of the Background Art

A typical integrated circuit has several vertically stacked levels, with any given level comprising one or more layers of materials. The topmost level in an integrated circuit is referred to as a "passivation level." The passivation level helps protect an integrated circuit's structures during packaging and in operation. Below the passivation level are metal and dielectric levels. Metal levels include metal lines for carrying electrical signals. Dielectric levels provide electrical isolation between metal levels.

The speed at which a signal is propagated in an integrated circuit is limited by the delay through the metal line carrying the signal. This delay, commonly known as "RC delay," is determined by the product of the resistance (R) and capacitance (C) of the metal line. Reducing the resistance and/or capacitance of a metal line lowers its RC delay and increases signal propagation speed. Thus, reducing the RC delay of metal lines plays a major role in making integrated circuits run faster.

Integrated circuit manufacturers have lowered RC delay by employing low resistance materials and low-k dielectric materials in levels below the passivation level. However, even lower RC delay is needed to meet the ever increasing demand for high speed integrated circuits.

SUMMARY

In one embodiment, a passivation level includes a low-k dielectric. To prevent the low-k dielectric from absorbing moisture when exposed to air, exposed portions of the low-k dielectric are covered with spacers. This facilitates integration of low-k dielectrics in passivation levels. Low-k dielectrics in passivation levels help lower capacitance on metal lines, thereby reducing RC delay and increasing signal propagation speeds.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, process parameters, materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
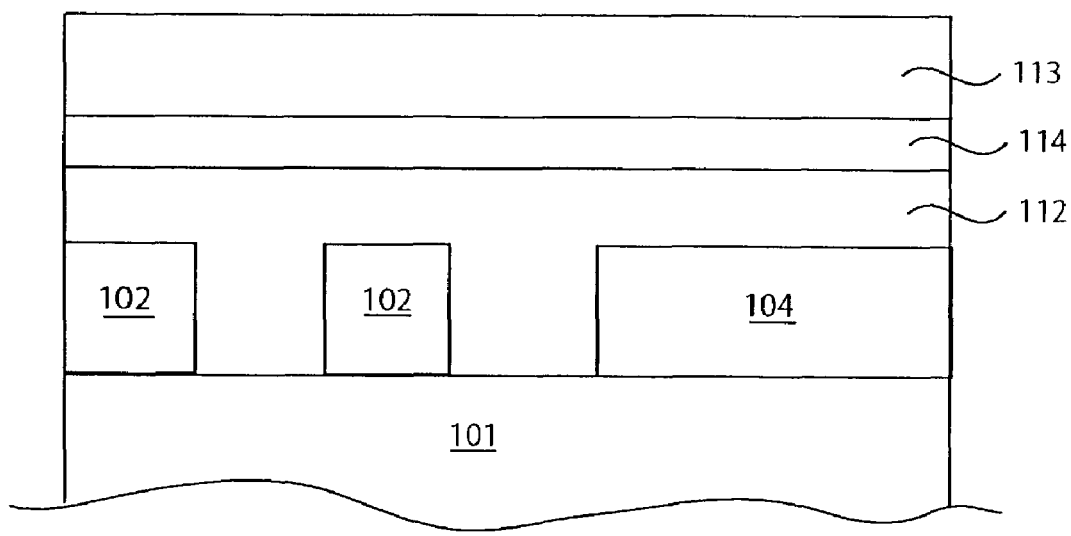
FIG. 1 shows a side cross-sectional view of a portion of an integrated circuit.

FIG. 1 shows a side cross-sectional view of a portion of an integrated circuit. The integrated circuit of FIG. 1 includes a passivation level that comprises a low-k dielectric 112, a dielectric 114, and a topside material 113. The passivation level helps protect metal lines 102 and a metal pad 104, which are in a "topmost metal level". That is, metal lines 102 and metal pad 104 are in a metal level just below the passivation level. The topmost metal level is formed over a dielectric level 101, which may be a layer of silicon dioxide. Additional levels that may be under dielectric level 101 are not shown for clarity of illustration. It is to be noted that as used in the present disclosure, the terms "over", "overlying", "under" and "underlying" refer to the relative placement of two materials that may or may not be directly in contact with each other. That is, the two materials may be separated by another material.

Metal lines 102 are conductive lines for carrying signals in an integrated circuit. In one embodiment, metal lines 102 comprise aluminum deposited by physical vapor deposition. Metal lines 102 may also be of other interconnect materials. A metal line 102 may also be a metal stack (i.e., having more than one layer of material).

The thickness of metal lines 102 depend on the application. Advantageously, metal lines 102 are deposited to be as thick as the application will allow to lower their resistance and the resulting RC delay. In one embodiment, an aluminum metal line 102 is deposited to a thickness of approximately 8000 Angstroms. In another embodiment, an aluminum metal line 102 is deposited to a thickness of approximately 12000 Angstroms.

Metal pad 104 provides a terminal for attaching conductive wires to the integrated circuit. For example, metal pad 104 may be exposed and then coupled to a lead wire that extends out of the integrated circuit. Metal pad 104 is structurally similar to a metal line 102 except that metal pad 104 is wider to provide a larger top surface area. Metal pad 104 may be of aluminum or other interconnect material. Metal pad 104 may also be a metal stack. For example, metal pad 104 may be a stack (not shown) that includes a 300 Angstroms thick titanium layer deposited on dielectric level 101, an 8000 Angstroms thick aluminum layer deposited on the titanium layer, and a 300 Angstroms thick titanium-tungsten (or titanium-nitride) layer deposited on the aluminum layer.

Low-k dielectric 112 may be a dielectric material having a relatively low dielectric constant. As used in the present disclosure, the term "low-k dielectric" refers to a dielectric material having a dielectric constant less than 3.9 (i.e., k<3.9). Low-k dielectric 112 may be deposited by chemical vapor deposition or spin-on process, for example.

The relatively low dielectric constant of low-k dielectric 112 helps lower capacitance on metal lines 102. In one embodiment where metal lines 102 and metal pad 104 are 8000 Angstroms thick, low-k dielectric 112 is deposited to a thickness of about 5000 Angstroms. In another embodiment where metal lines 102 and metal pad 104 are 12000 Angstroms thick, low-k dielectric 112 is deposited to a thickness of about 8000 Angstroms. The thickness of low-k dielectric 112 may vary depending on the application.

In one embodiment, low-k dielectric 112 is deposited using commercially available low-k dielectric deposition technologies. For example, low-k dielectric 112 may be deposited using the Flowfill® dielectric deposition technology from Trikon Technologies of the United Kingdom, the SiLK™ dielectric deposition technology from The Dow Chemical Company, or the fluorinated silicate glass (FSG) deposition technology from Novellus Systems, Inc. or Applied Materials, Inc.

Still referring to FIG. 1, dielectric 114 is deposited over low-k dielectric 112. In one embodiment, dielectric 114 comprises a layer of silicon dioxide deposited to a thickness of about 1000 Angstroms by plasma enhanced chemical vapor deposition (PECVD). Topside material 113 is deposited over dielectric 114. Topside material 113, dielectric 114, and low-k dielectric 112 form a passivation level that helps protect metal lines 102, metal pad 104, and other underlying structures. In one embodiment, topside material 113 comprises silicon nitride deposited to a thickness of about 9000 Angstroms by PECVD.

Some low-k dielectrics may absorb moisture when exposed to air. This may cause portions of the passivation level to crack and may also cause the dielectric constant of the low-k dielectric to increase. A low-k dielectric may be exposed to air several ways. For example, a metal pad etch process that includes etching topside material 113, dielectric 114, and low-k dielectric 112 to expose metal pad 104 also exposes low-k dielectric 112. In accordance with an embodiment of the present invention, a spacer may then be formed on a resulting sidewall to cover and protect exposed portions of low-k dielectric 112.

Figure 2A:
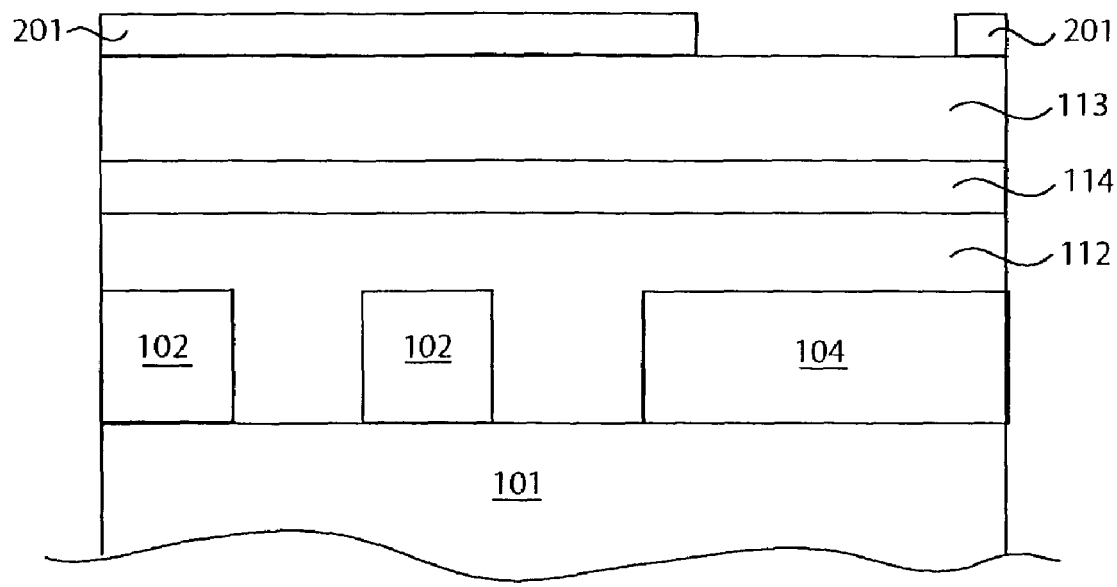
FIGS. 2(a)–2(e) show side cross-sectional views of an integrated circuit being fabricated in accordance with an embodiment of the present invention.

FIGS. 2(a)–2(e) show side cross-sectional views of an integrated circuit being fabricated in accordance with an embodiment of the present invention. Referring to FIG. 2(a), masks 201 are formed over the sample of FIG. 1 to define a pattern for exposing metal pad 104. Masks 201 may be of a resist material and formed by photolithography.

Figure 2B:
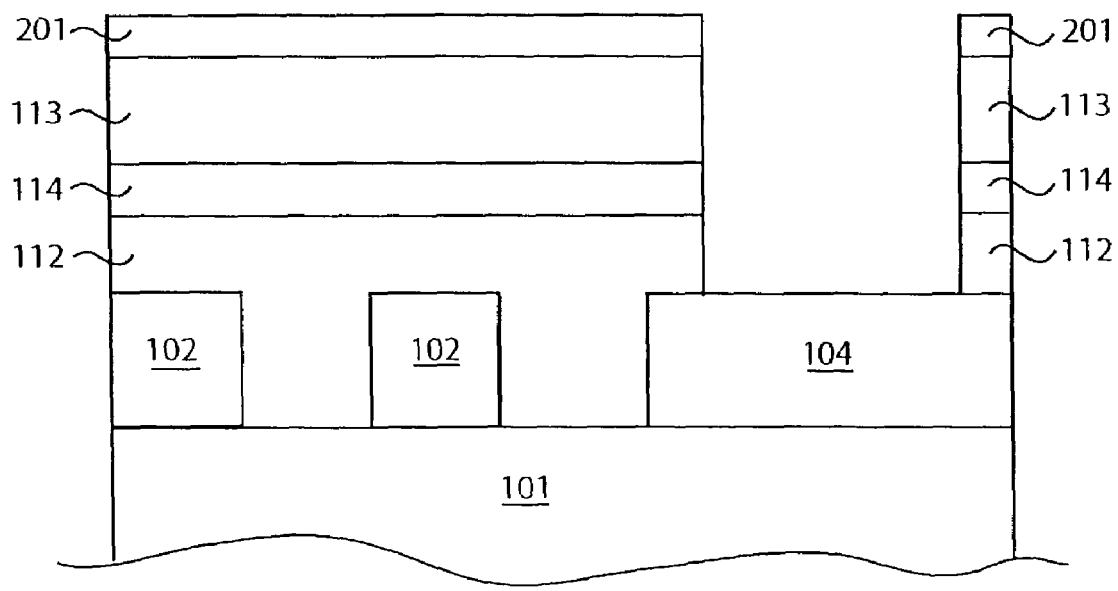

In FIG. 2(b), metal pad 104 is exposed by etching through topside material 113, dielectric 114, and low-k dielectric 112. Note that exposing metal pad 104 also exposes a portion of low-k dielectric 112 in the resulting sidewalls. In one embodiment, metal pad 104 is exposed using a conventional metal pad etch process based on a chemistry comprising $SF_6/CHF_3/CF_4/Ar$.

Figure 2C:
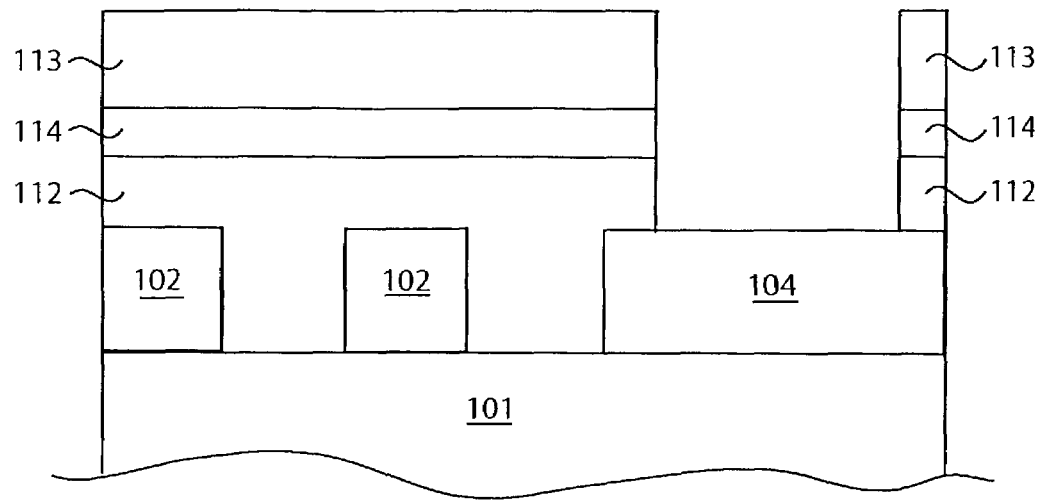

In FIG. 2(c), masks 201 are removed off topside material 113.

Figure 2D:
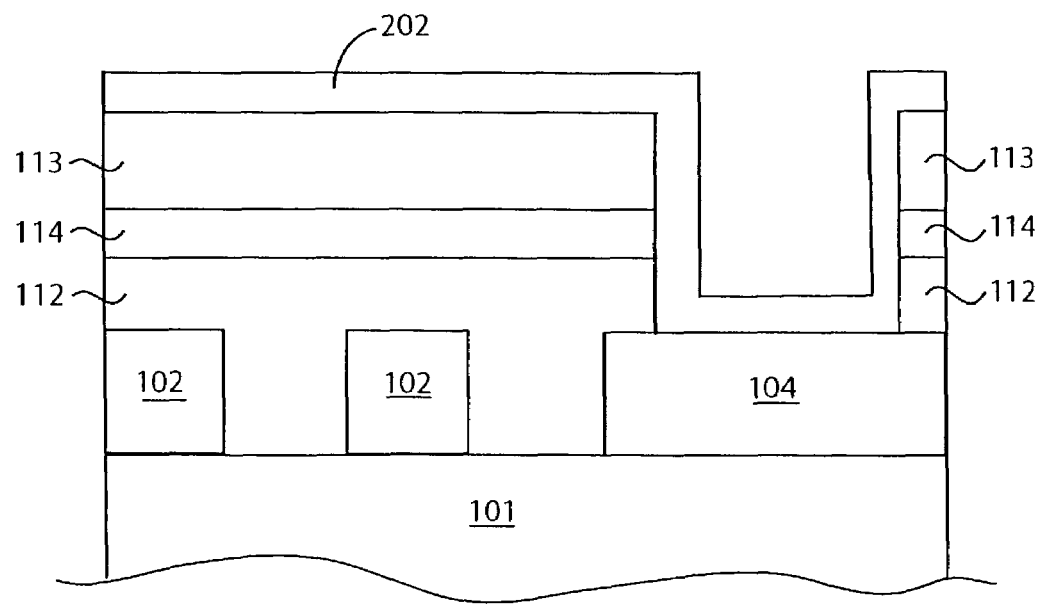

In FIG. 2(d), a spacer material 202 is deposited on the passivation level, thereby covering exposed portions of low-k dielectric 112. Spacer material 202 may be a material that provides a good barrier against moisture. Preferably, spacer material 202 comprises silicon nitride. Other materials, such as silicon oxynitride or silicon dioxide, may also be used as a spacer material 202. In one embodiment, the sample of FIG. 2(c) is baked (i.e., heated) prior to depositing spacer material 202 thereon. The baking step outgases any humidity on the passivation level. The baking step may be performed inside the same process chamber used to deposit spacer material 202. For example, a heated pedestal supporting a sample (i.e., a wafer) on the process chamber may be activated to heat the sample prior to the spacer material deposition.

In one embodiment, spacer material 202 comprises silicon nitride deposited to a thickness of 3000 Angstroms by PECVD. The thickness of spacer material 202 will depend on the application. For example, spacer material 202 may also be deposited to a thickness of 2000 Angstroms, 4,000 Angstroms, or between 2,000 and 4,000 Angstroms.

Figure 2E:
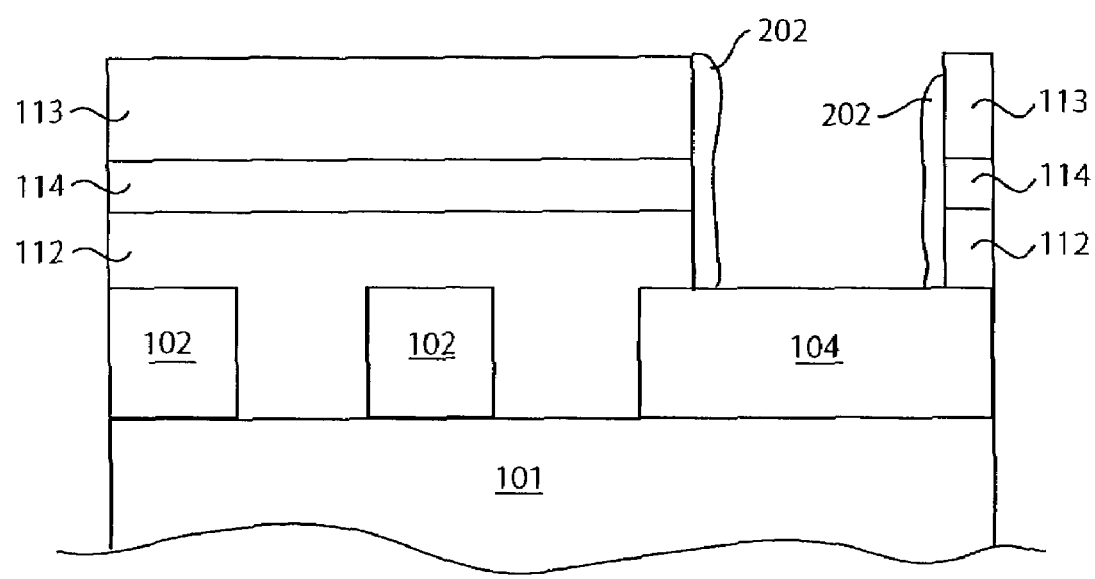

In FIG. 2(e), spacer material 202 is etched to form spacers 202. Spacers 202 may be formed along sidewalls that include exposed portions of low-k dielectric 112. Spacers 202 advantageously cover exposed portions of low-k dielectric 112, thereby preventing the low-k dielectric 112 from absorbing moisture. In one embodiment, spacers 202 are formed by plasma etching spacer material 202. Because the spacer etch process is anisotropic, portions of spacer material 202 on the surface of metal pad 104 and topside material 113 are etched while leaving portions of spacer material 202 on the sidewalls. The spacer etch process may be a conventional etch process using a chemistry comprising $CHF_3/Ar$, for example. The spacer etch process forms spacers 202 and exposes metal pad 104. In one embodiment, etching a 3000 Angstroms thick silicon nitride spacer material resulted in an 1800 Angstroms wide spacer.

Plasma etching spacer material 202 may result in polymer generation and re-sputtering of metal pad 104. Thus the sample of FIG. 2(e) may have to undergo a cleaning process after the formation of spacers 202. In one embodiment, the sample of FIG. 2(e) is cleaned using an ashing process followed by a residue remover bath. An example suitable residue remover is the EKC265™ residue remover commercially available from EKC Technology, Inc. of Hayward, Calif.

Figure 3:
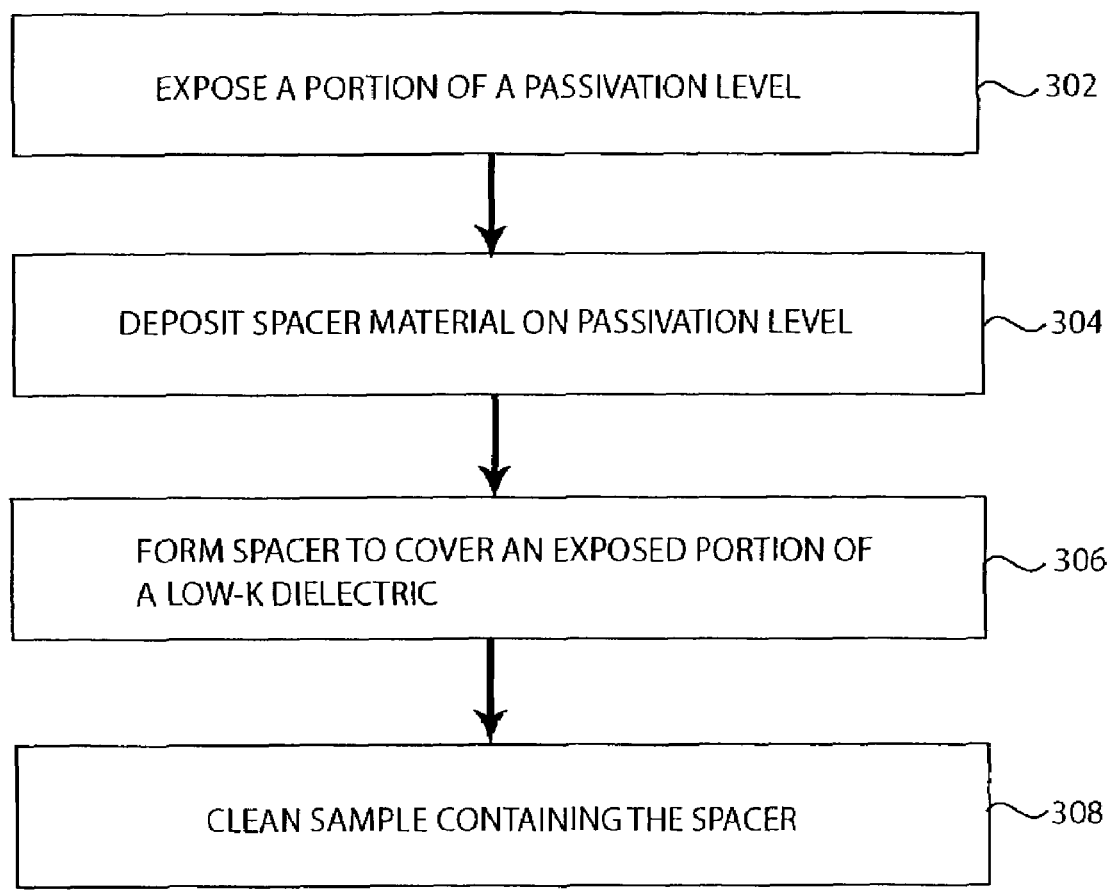
FIG. 3 shows a flow diagram of a method of protecting a low-k dielectric in a passivation level in accordance with an embodiment of the present invention.

FIG. 3 shows a flow diagram of a method of protecting a low-k dielectric in a passivation level in accordance with an embodiment of the present invention. In action 302, a portion of a passivation level is exposed. This may be performed by, for example, etching a passivation level to expose a metal pad.

In action 304, a spacer material is deposited on the passivation level. For example, a spacer material comprising silicon nitride may be deposited on the passivation level to cover the low-k dielectric that have been exposed in action 302.

In action 306, a spacer is formed to cover the exposed portion of the low-k dielectric in the passivation level. The spacer may be formed by etching the spacer material. In one embodiment, the resulting spacer is formed on a sidewall of a cavity including a metal pad.

In action 308, the sample (e.g., wafer) containing the spacer is cleaned to remove polymers and re-sputtered materials. The sample may be cleaned by ashing it and then dipping it in a bath of residue remover, for example.

As can be appreciated, embodiments of the present invention facilitate integration of a low-k dielectric in a passivation level. The low-k dielectric helps lower capacitance on a topmost metal level, thereby reducing RC delay and increasing signal propagation speeds.

Figure 4A:
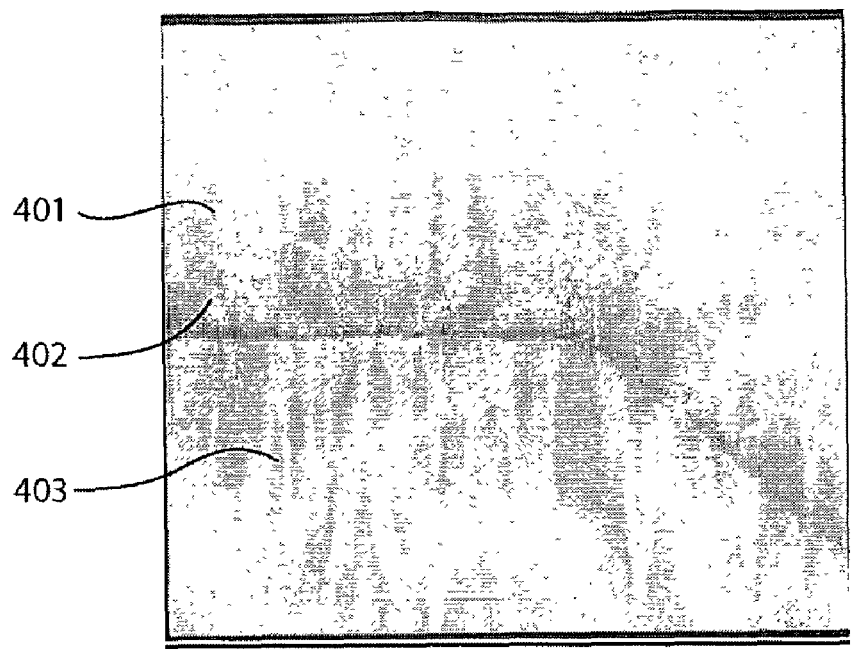
FIGS. 4(a)–4(c), FIG. 5, and FIG. 6 show scanning electron micrographs of integrated circuits in accordance with embodiments of the present invention.
Figure 4B:
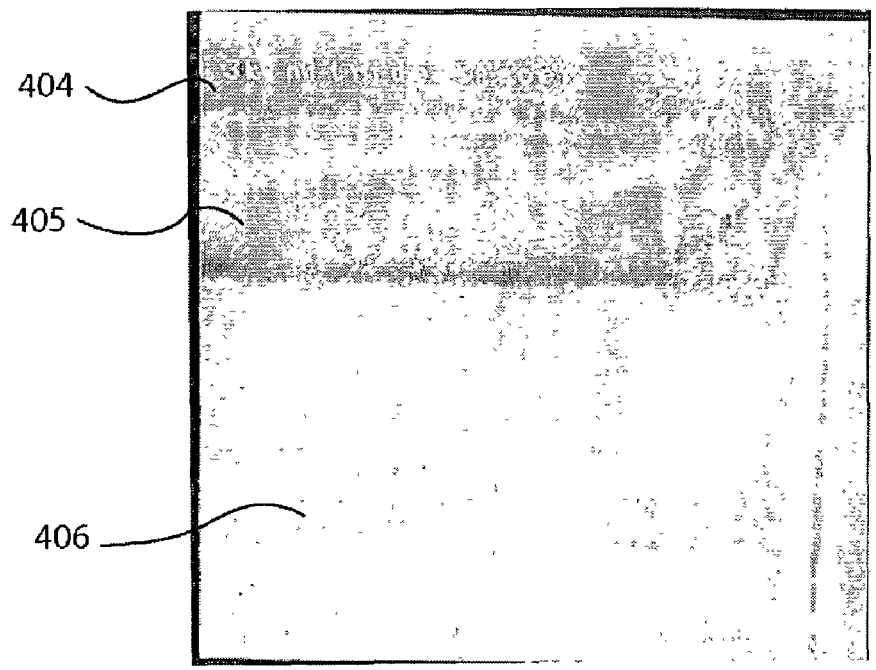
Figure 4C:
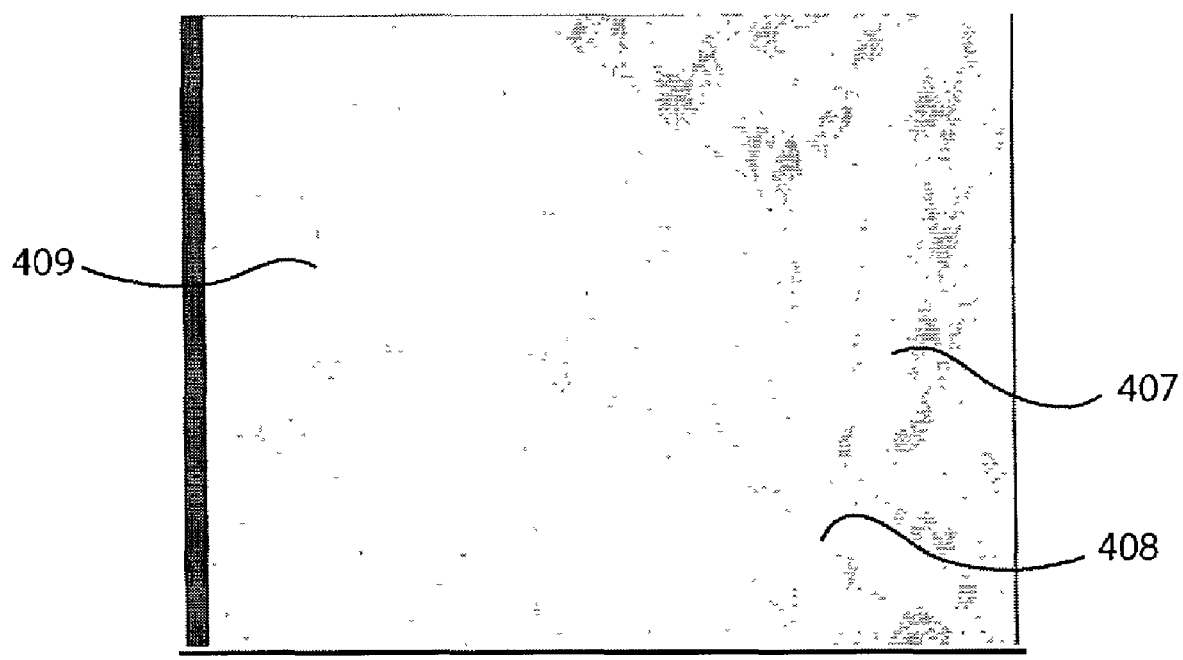
Figure 5:
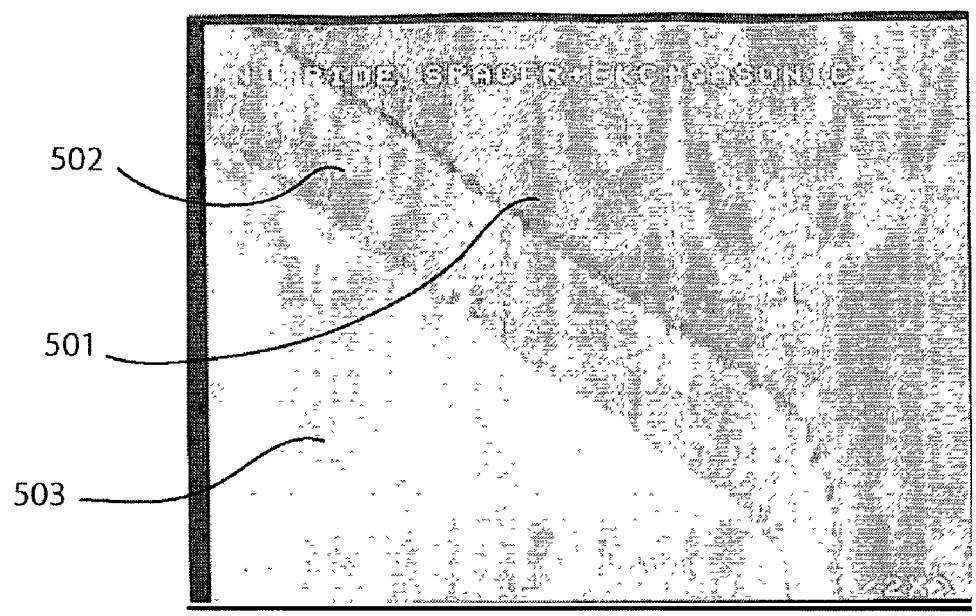
Figure 6:
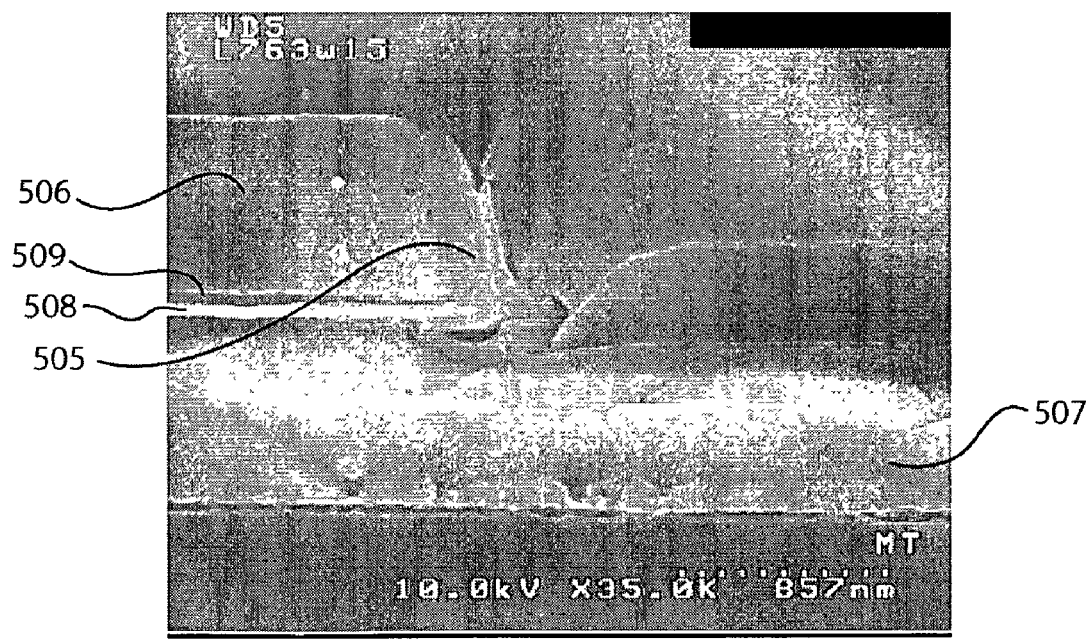

FIGS. 4(a)–4(c), FIG. 5, and FIG. 6 show scanning electron micrographs of integrated circuits in accordance with embodiments of the present invention. FIGS. 4(a)–4(c) and FIG. 5 show top views, while FIG. 6 shows a side cross-sectional view. Note that the integrated circuits shown in FIGS. 4(a)–4(c), FIG. 5, and FIG. 6 did not have a low-k dielectric in their respective passivation levels. However, because a low-k dielectric in a passivation level will not substantially affect the formation of a spacer, the following micrographs give a good indication of how a spacer will form in a passivation level.

In FIG. 4(a), a spacer 402 was formed on a sidewall 401 substantially perpendicular to a metal pad 403. Sidewall 401 was part of a passivation level that included a silicon nitride topside material and a silicon dioxide dielectric. Spacer 402 was formed by etching a 2000 Angstroms thick UV nitride spacer material deposited by PECVD.

In FIG. 4(b), a spacer 405 was formed on a sidewall 404 substantially perpendicular to a metal pad 406. Sidewall 404 was part of a passivation level that included a silicon nitride topside material and a silicon dioxide dielectric. Spacer 405 was formed by etching a 3000 Angstroms thick silicon nitride spacer material deposited by PECVD. Comparing FIGS. 4(a) and 4(b), spacer 402 of UV nitride does not exhibit any noticeable advantage over spacer 405 of silicon nitride. Thus, selecting either silicon nitride or UV nitride as spacer material will depend on the application. Other materials that may serve as a barrier against moisture may also be used as a spacer material.

In FIG. 4(c), a spacer 408 was formed on a sidewall 407 substantially perpendicular to a metal pad 409. Sidewall 407 was part of a passivation level that included a silicon nitride topside material and a silicon dioxide dielectric. Spacer 408 was formed by etching a 4000 Angstroms thick silicon nitride spacer material deposited by PECVD. Comparing FIG. 4(b) to FIG. 4(c), spacer 405 looks more robust than spacer 408. Although spacer 405 is preferable to spacer 408, this does not mean that spacer 408 is not useful in other applications.

FIG. 5 shows a spacer 502 of silicon nitride formed on a sidewall 501 substantially perpendicular to a metal pad 503. Sidewall 501 was part of a passivation level that included a silicon nitride topside material and a silicon dioxide dielectric. The micrograph of FIG. 5 was taken after a cleaning process that included ashing the wafer in a Gasonics™ reactor and then dipping the wafer in a bath of EKC265™ residue remover. The cleaning process smoothed the surface of the topside material, spacer 502, and metal pad 503.

The side cross-sectional view of FIG. 6 shows a silicon nitride spacer 505 formed on a sidewall of a passivation level that included a silicon nitride topside material 506 and a dielectric 509 of silicon dioxide. Also shown in FIG. 6 is a metal pad 507 that included aluminum and a capping layer 508 of titanium-tungsten. Note the good adhesion of spacer 505 to the passivation level.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A method of protecting a low-k dielectric in a passivation level, the method comprising:
    exposing a portion of a passivation level to expose a metal pad in the passivation level, the passivation level being a topmost level of an integrated circuit;
    covering an exposed low-k dielectric in the passivation level; and
    coupling the metal pad to wiring extending out of the integrated circuit.

2. The method of claim 1 wherein covering the exposed low-k dielectric in the passivation level comprises forming a spacer.

3. The method of claim 2 wherein the spacer comprises a material selected from the group consisting of silicon nitride, UV nitride, and silicon oxynitride.

4. The method of claim 1 wherein the low-k dielectric has a dielectric constant less than about 3.9.

5. The method of claim 1 wherein covering the exposed low-k dielectric comprises forming a spacer on a sidewall that includes the exposed low-k dielectric.

6. The method of claim 1 further comprising:
    cleaning a wafer containing the passivation level after covering the exposed low-k dielectric in the passivation level.

7. The method of claim 6 wherein cleaning the wafer comprises dipping the wafer in a bath of residue remover.

8. The method of claim 6 wherein cleaning the wafer comprises ashing the wafer.

9. The method of claim 1 wherein covering the exposed low-k dielectric in the passivation level comprises:
    depositing a spacer material over the passivation level; and
    etching the spacer material to form a spacer.

10. A method of protecting a low-k dielectric in a passivation level, the method comprising:
    etching through a passivation level to expose a metal pad in a topmost metal level of an integrated circuit, the passivation level including a low-k dielectric material filling a space between the metal pad and a metal line in the topmost metal level;
    depositing a spacer material over the passivation level;
    etching the spacer material to form a spacer covering a sidewall including a portion of the low-k dielectric material exposed by the etching through the passivation level; and
    coupling the metal pad to a lead wire extending out of the integrated circuit.

11. The method of claim 10 wherein the passivation level comprises the low-k dielectric material, a dielectric material over the low-k dielectric material, and a topside material over the dielectric material.

12. The method of claim 11 wherein the dielectric material comprises silicon dioxide.

13. The method of claim 11 wherein the topside material comprises silicon nitride.

* * * * *